(12) United States Patent
Gaide (10) Patent No.: US 7,683,664 B1
(45) Date of Patent: Mar. 23, 2010

(54) SELECTION CIRCUIT WITH PROGRAMMABLE CONSTANT OUTPUT

(75) Inventor: Brian C. Gaide, Glassboro, NJ (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 12/356,869

(22) Filed: Jan. 21, 2009

(51) Int. Cl.
*H03K 19/173* (2006.01)

(52) U.S. Cl. .......................................... 326/38; 326/113

(58) Field of Classification Search ............. 326/37–41, 326/112, 113
See application file for complete search history.

(56) References Cited

U.S. PATENT DOCUMENTS 6,998,872 B1 * 2/2006 Chirania et al. ............... 326/40

7,053,654 B1 * 5/2006 Young et al. ................... 326/44

* cited by examiner

*Primary Examiner*—Don P Le
(74) *Attorney, Agent, or Firm*—LeRoy D. Maunu (57) ABSTRACT

A selection circuit, such as a multiplexer circuit, programmable to hold the output signal at a constant logic level or select 1 of n input signals as the output signal is disclosed. A first bank of transistors receives the n input signals and is controlled by a first set of memory cells. A second bank of transistors is controlled by a second set of memory cells. At least two transistors of the second bank have gates are coupled to a complemented output of one of the second set of memory cells. Each transistor in the second bank is coupled to a subset of transistors of the first bank. An output stage is coupled to the second bank of transistors. A pair of serially coupled transistors has gates coupled to two memory cells of the second set that control the at least two transistors of the second bank. The output stage outputs the constant logic level signal when the serially coupled transistors are conducting, and outputs the selected input signal when the serially coupled transistors are not conducting.

20 Claims, 5 Drawing Sheets

SELECTION CIRCUIT WITH PROGRAMMABLE CONSTANT OUTPUT

FIELD OF THE INVENTION

The present invention generally relates to a selection circuit such as a multiplexer circuit.

BACKGROUND

A multiplexer generally selects one of multiple input signals in response to one or more control signals and outputs the selected signal. In one application, multiplexers are used in the programmable signal routing structure of programmable logic devices (PLDs). These multiplexers may be referred to as interconnect multiplexers. The interconnect multiplexers are programmed based on a particular design having been synthesized, mapped, placed, and routed. For a PLD circuit design, a configuration bitstream is generated from the placed-and-routed design data. The configuration bitstream programs each interconnect multiplexer according to the required routing.

Various programmable resources of a PLD may be unused by an implemented design, resulting in some of the logic pins in a PLD being unused. One PLD implementation requires these unused logic pins to be driven with a logic high signal. The signal that drives an unused logic pin with a logic high signal is provided by one of the interconnect multiplexers, which is programmed to always output a logic high signal.

Two example approaches have been used to make an interconnect multiplexer programmable to always output a logic high signal. In one approach, one of the input pins of the interconnect multiplexer is tied to the power supply voltage and the interconnect multiplexer is programmable to always select that input pin. This approach reduces the available connectivity of the interconnect multiplexer because one of the input pins is always tied to the power supply voltage regardless of whether the interconnect multiplexer is programmed to route a signal of the design or is programmed to provide the logic high signal to an unused logic pin.

Another approach is to force an internal node of the interconnect multiplexer to logic high with a power-on reset signal, and further rely on a half-latch to hold the node at logic high. With the half-latch approach, it may be difficult for silicon verification (product and test engineering) to test whether or not the half-latch is functioning properly. In addition, there may be scenarios in which the PLD is partially reconfigured and the state of the half-latch cannot be guaranteed to be logic high. Also, there is no apparent manner to detect if the half-latch is flipped to logic low.

The present invention may address one or more of the above issues.

SUMMARY

In one embodiment of the present invention, a selection circuit is programmable in a first state to hold the output signal of the selection circuit at a constant logic level and programmable in a second state to select 1 of n input signals as the output signal. The selection circuit includes a first bank of transistors has sources receiving n input signals, and has gates coupled to a first set of memory cells. A second bank of transistors includes two or more transistors having gates coupled to a second set of memory cells. At least two transistors of the second bank have gates coupled to a complemented output of a respective one of the second set of memory cells, and each transistor in the second bank has a source coupled to drains of transistors in a respective subset of transistors of the first bank. An output stage is coupled to drains of the second bank of transistors. A pair of serially coupled transistors is coupled to a constant logic level signal and has gates coupled to two memory cells of the second set that control the at least two transistors of the second bank. The output stage outputs the constant logic level signal in response to the selection circuit being programmed for the serially coupled transistors to conduct the constant logic level signal, and the output stage outputs the selected input signal in response to the selection circuit being programmed to select a signal and the serially coupled transistors not conducting.

In another embodiment, a selection circuit is programmable in a first state to hold the output signal of the selection circuit at a constant logic level and is programmable in a second state to select 1 of n input signals as the output signal. The selection circuit includes a first bank of transistors having sources receiving the n input signals, and having gates coupled to a first set of memory cells. A second bank of transistors includes two or more transistors having gates coupled to a second set of memory cells. At least two transistors of the second bank have gates coupled to a complemented output of a respective one of the second set of memory cells, and each transistor in the second bank has a source coupled to drains of transistors in a respective subset of transistors of the first bank. An output stage is coupled to drains of the second bank of transistors. The selection circuit includes means, responsive to states of two memory cells of the second set that control the at least two transistors of the second bank, for providing the signal at the constant logic level to the output stage in response to the selection circuit being programmed in the first state, and for providing the selected input signal to the output stage in response to the selection circuit being programmed in the second state.

In yet another embodiment of the present invention, an integrated circuit includes a plurality of programmable logic resources, a plurality of programmable interconnect resources, and a configuration memory coupled to the programmable logic resources and to the programmable interconnect resources. One or more of the programmable interconnect resources includes an interconnect multiplexer, programmable in a first state to hold the output signal of the multiplexer at a constant logic level and programmable in a second state to select 1 of n input signals as the output signal. The multiplexer includes a first bank of transistors which has sources receiving n input signals, and has gates coupled to a first set of memory cells. A second bank of transistors includes two or more transistors having gates coupled to a second set of memory cells. At least two transistors of the second bank have gates coupled to a complemented output of a respective one of the second set of memory cells, and each transistor in the second bank has a source coupled to drains of transistors in a respective subset of transistors of the first bank. An output stage is coupled to drains of the second bank of transistors. A pair of serially coupled transistors is coupled to a constant logic level signal and has gates coupled to two memory cells of the second set that control the at least at least two transistors of the second bank. The output stage outputs the constant logic level signal in response to the multiplexer being programmed for the serially coupled transistors to conduct the constant logic level signal, and the output stage outputs the selected input signal in response to the multiplexer being programmed to select a signal and the serially coupled transistors is not conducting.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Various embodiments of the invention improve upon prior art interconnect multiplexers by eliminating the dedicated connection of one of the input pins of the multiplexer to the power supply voltage. The input pin formerly dedicated to the power supply voltage may instead be used to route a design signal. Alternatively, the interconnect multiplexer may be constructed with one less input pin and controlling memory cell if interconnect requirements permit.

A two-stage multiplexer circuit has a transistor stack connected between a constant voltage level and a node at the input of the output stage of the multiplexer. The transistor stack is controlled by two of the memory cells that control pass gates in the second stage of the multiplexer. When the multiplexer is programmed to an unused state, the transistor stack is turned on to provide the constant logic level signal at the output of the multiplexer. When the multiplexer is programmed to a used state, at most one transistor of the transistor stack is turned on by the memory cells that control the second stage pass gates. The constant logic level signal output by the multiplexer refers to a signal at one logic level being output independent of the input signals to the multiplexer. Embodiments are disclosed for programming the multiplexer to provide a constant logic high signal, and other embodiments provide an approach for holding the multiplexer output signal at a logic low level.

Figure 1:
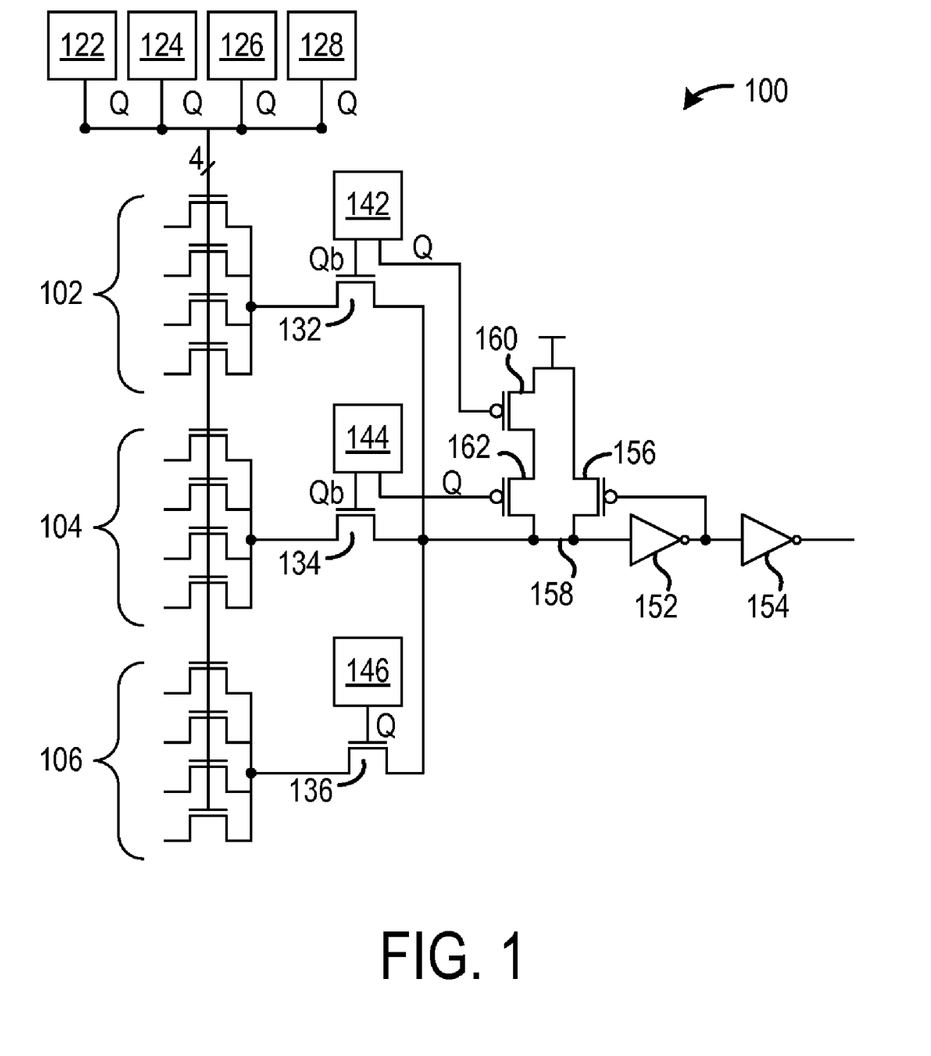
FIG. 1 is a circuit diagram of a multiplexer in accordance with one embodiment of the invention.

FIG. 1 is a circuit diagram of a multiplexer 100 in accordance with one embodiment of the invention. The example multiplexer is a 12:1, two stage multiplexer. The first stage pass gates are divided into three groups 102, 104, and 106 of four pass gates. The first stage pass gates are controlled by memory cells 122, 124, 126, and 128, which are programmable by way of a configuration bitstream, for example. Each of the four memory cells controls one of the four pass gates in each of the groups 102, 104, and 106 by way of the Q output of the memory cell.

The drains of the pass gates in each group are coupled to the source of a respective second stage pass gate. In the example, drains of group 102 pass gates are coupled to pass gate 132, drains of group 104 pass gates are coupled to pass gate 134, and drains of group 106 pass gates are coupled to pass gate 136. Thus, the signal from the selected pass gate in a group is provided to the second stage pass gate.

Each of the second stage pass gates is controlled by a respective memory cell. Memory cell 142 controls pass gate 132, memory cell 144 controls pass gate 134, and memory cell 146 controls pass gate 136. For two of the second stage pass gates, e.g., 132 and 134, the complemented output (labeled Qb and referred to as Q-bar) of the associated controlling memory cell is used for control. The third pass gate 136 is controlled by the Q output of memory cell 146.

The multiplexer 100 includes an output stage having serially coupled inverters 152 and 154, along with the PMOS feedback keeper 156. The gate of the feedback keeper is controlled by the signal between the inverters, the source of the feedback keeper is tied to the power supply voltage for providing a logic high signal, and the drain of the feedback keeper is connected to node 158, which is at the input of the output stage and is common with the drains of the second stage pass gates 132, 134, and 136.

Also sharing the connection to node 158 is the transistor stack that includes PMOS transistors 160 and 162. The PMOS transistors 160 and 162 are serially connected and are controlled by the Q outputs of memory cells 142 and 144. The source of PMOS transistor 160 is tied to the power supply voltage for providing a logic high signal to the shared node 158 when switched on.

To configure the multiplexer to a used state (select one of the input signals), the memory cell of the required second stage pass gate is programmed to output a logic high signal on the Q output, unless the required second stage pass gate is one of the pass gates controlled by Qb (e.g., 132 and 134). If the required second stage pass gate is one of the pass gates controlled by Qb, that memory cell is programmed to output a logic low signal on the Q output. For example, if the required second stage pass gate is 136, memory cell 146 is programmed to provide a logic high signal on the Q output. If the required second stage pass gate is 134, memory cell 144 is programmed to provide logic low on the Q output, the result being logic high being output on the Qb output to turn on pass gate 134. It will be appreciated that one of the first stage memory cells 122, 124, 126, or 128 must be programmed to output logic high on the Q output in order to route the signal through the first stage and on to the second stage.

When the multiplexer is configured in a used state, only one of the second stage memory cells 142, 144, or 146 is programmed to activate the associated pass gate. The other two second stage are programmed to turn off the associated pass gate. To turn off the leg through pass gate 136, memory cell 146 is programmed to output logic low on the Q output. To turn off either of the legs through pass gates 132 or 134, one of memory cells 142 or 144 is programmed to output logic high on the Q output, resulting in logic low at the Qb outputs.

When the multiplexer is in a used state, only one of the second stage pass gates is conducting, and only one of the PMOS transistors 160 or 162 is turned on, thereby isolating the node from the power supply voltage provided to the PMOS transistor stack.

To program the multiplexer to an unused stage (output logic high independent of the state of the input signals), the memory cells 142 and 144 that control the second stage pass gates 132 and 134 with the Qb outputs are both programmed to output logic low on the Q output, and the memory cell 146 that controls the second stage pass gate 136 with the Q output is programmed to provide logic low on the Q output. This results in the Q outputs of memory cells 142 and 144 being logic low, which turns on PMOS transistors 160 and 162 in the transistor stack and thereby provides the power supply voltage at logic high to the input node 158 of the output stage. Pass gate 136 is turned off. While it is true that the multiplexer in an unused state does not route a selected input signal to the output, the constant logic high signal may be used for input to logic and may be useful for downstream logic functions.

On power up of the circuit containing the multiplexer 100, the memory cells are initially programmed to provide logic low at the Q output. Since the transistor stack including PMOS transistors 160 and 162 receives the Q outputs of the memory cells 142 and 144, respectively, the node at the input to the output stage is pulled high causing the multiplexer to output a logic high signal. Even though the pass gates 132 and 134 are turned on at power up, there is no short to the power supply because the first stage transistors are turned off due to the logic low Q output of memory cells 122, 124, 126, and 128.

Figure 2:
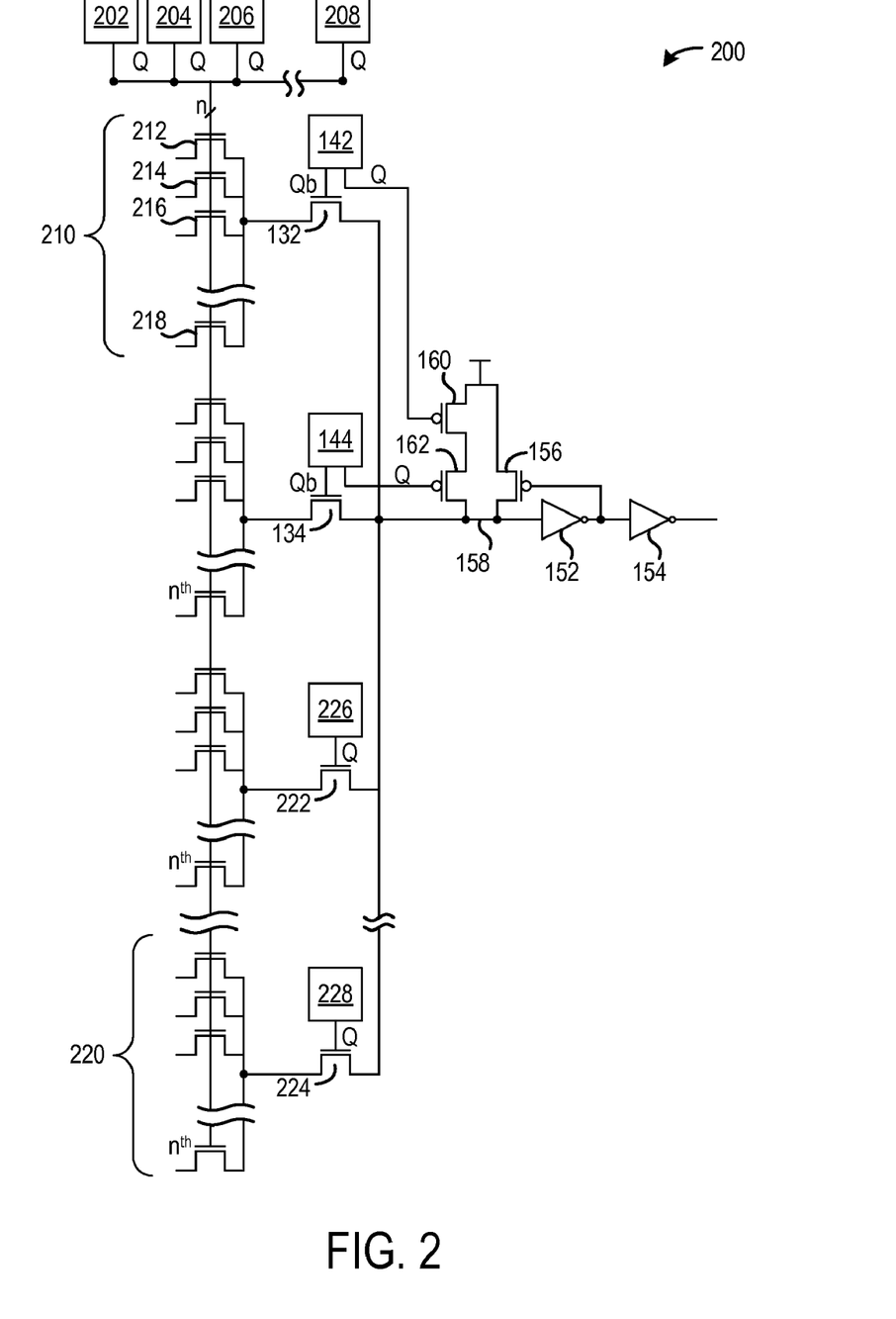
FIG. 2 is a circuit diagram of an (m×n):1, two-stage multiplexer in accordance with various embodiments of the invention.

FIG. 2 is a circuit diagram of an (m×n):1, two-stage multiplexer 200 in accordance with various embodiments of the invention. There are m groups and n pass gates in each group. The number of pass gates in each group would generally be influenced by layout requirements. It is also beneficial to minimize the number of memory cells used. A 16:1 multiplexer would require 8 memory cells if constructed with 4 groups of 4 pass gates in the first stage and 4 pass gates in the second stage. However, 10 memory cells would be required if the 16:1 multiplexer were constructed with 2 groups of 8 pass gates in the first stage and two pass gates in the second stage. Additionally, more selection in the first stage versus the second stage affects performance by changing whether the dominant portion of the capacitive load is after one pass gate or two. A larger first stage may be faster because most of the capacitance is charged before going through the second pass gate (resistor).

The size of the multiplexer may be influenced by the routability requirements of the device. For example, a greater number of inputs allows a greater number of routing options for routing signals along different paths. However, while large multiplexors provide greater routing flexibility, they are slower and require more circuit area.

Memory cells 202, 204, 206, and 208 each control a respective one of the n first-stage pass gates in each of the m groups. For example, in group 210, memory cell 202 controls pass gate 212, memory cell 204 controls pass gate 214, memory cell 206 controls pass gate 216, and memory cell 208 controls the $n^{th}$ pass gate 218. Group 220 is the $m^{th}$ group.

As with the multiplexer 100 of FIG. 1, two of the second-stage pass gates, e.g., 132 and 134, are controlled by the Qb outputs of the associated memory cells, e.g., 142 and 144, and the Q outputs of these memory cells control the transistor stack, which includes transistors 160 and 162, connected between the power supply voltage and the node 158 at the input of the output stage. The remaining second-stage pass gates, e.g., 222 and 224, are controlled by the Q outputs of the associated memory cells, e.g., 226 and 228.

Figure 3:
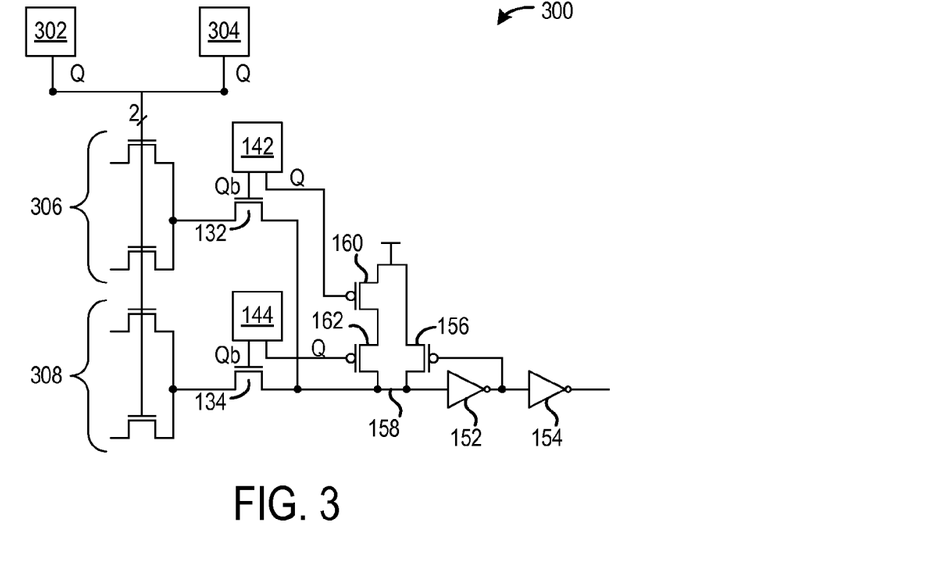
FIG. 3 is a circuit diagram of a 4:1 multiplexer in accordance with an embodiment of the invention.

FIG. 3 is a circuit diagram of a 4:1 multiplexer 300 in accordance with an embodiment of the invention. Memory cells 302 and 304 each control a respective one of the 2 first-stage pass gates in each of the 2 groups 306 and 308.

The two second-stage pass gates, e.g., 132 and 134, are controlled by the Qb outputs of the associated memory cells 142 and 144, and the Q outputs of these memory cells control the transistor stack, which includes transistors 160 and 162, connected between the power supply voltage and the node 158 at the input of the output stage. The multiplexer 300 may be configured to operate in either a used or unused state as described above for multiplexer 100 of FIG. 1.

Those skilled in the art will recognize that the multiplexers described herein may be adapted to provide a constant logic low signal instead of a constant logic high signal. For example, for multiplexers 100, 200, and 300, the transistor stack would be tied to ground instead of the power supply voltage. In addition, other changes may be required. For example, it may be desirable to use NMOS transistors in the stack instead of PMOS transistors.

Figure 4:
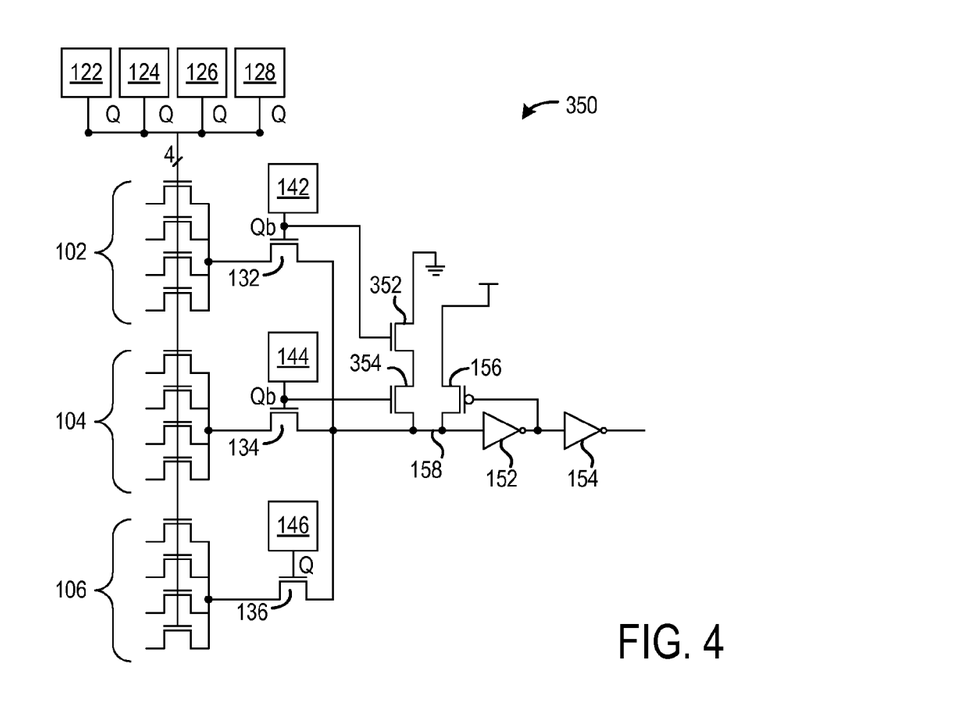
FIG. 4 is a circuit diagram of an example 12:1 multiplexer that may be configured to provide a constant logic low signal in accordance with various embodiments of the invention.

FIG. 4 is a circuit diagram of an example 12:1 multiplexer that may be configured to provide a constant logic low signal in accordance with various embodiments of the invention. Configuration and operation of the multiplexer is analogous to that described above for the multiplexers 100, 200, and 300. When the multiplexer 350 is programmed to an unused state to provide constant logic low, memory cells 142 and 144 are programmed to output logic low on the Q output (logic high on the Qb output), and memory cell 146, along with memory cells 122, 124, and 126, are programmed to output logic low on the Q output.

Figure 5:
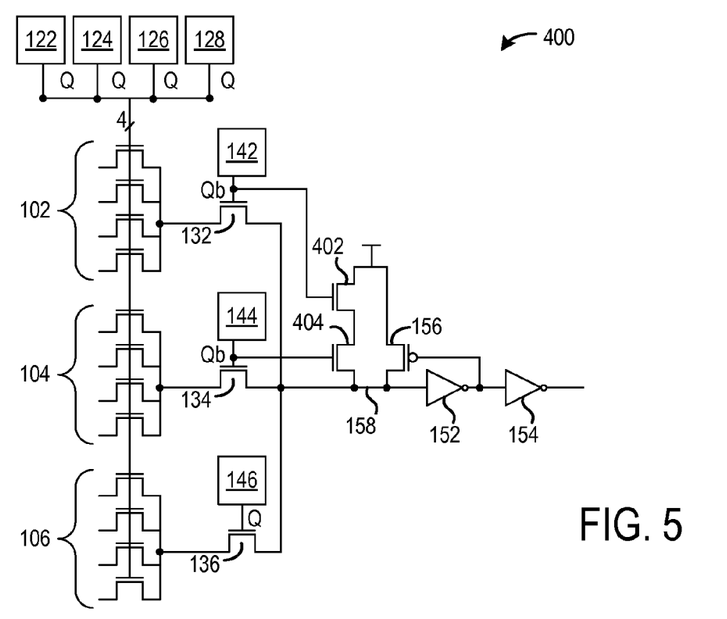
FIG. 5 is a circuit diagram of an example 12:1 multiplexer in which NMOS transistors are used in the transistor stack to control provision of the constant logic high output signal.

FIG. 5 is a circuit diagram of an example 12:1 multiplexer 400 in which NMOS transistors 402 and 404 are used in the transistor stack to control provision of the constant logic high output signal (instead of the PMOS transistors 160 and 162 as shown in the embodiment of FIG. 1). The Qb output from memory cell 142 is coupled to the gate of transistor 402, and the Qb output from memory cell 144 is coupled to the gate of transistor 404. The gates of pass gates 132 and 134 are also coupled to the Qb outputs of memory cells 142 and 144, respectively.

To configure the multiplexer 400 to a used state for one of the legs provided by pass gates 132 or 134, the memory cell of the required second-stage pass gate is programmed to output a logic low signal on the Q output, which would turn on the one of pass gates 132 or 134 by way of the Qb output. The memory cell controlling the unused one of pass gates 132 or 134 would be programmed to output logic high on the Q output. The memory cell 146 controlling the unused pass gate 136 would be programmed to provide logic low on the Q output. To configure the leg having pass gate 136 for signal selection, memory cell 146 is programmed to provide logic high on the Q output, as are both of memory cells 142 and 144.

When the multiplexer 400 is in a used state, only one of the second stage pass gates is conducting, and only one of the NMOS transistors 402 or 404 is turned on, thereby isolating the node 158 from the power supply voltage provided to the NMOS transistor stack.

To program the multiplexer to an unused stage, the memory cells 142 and 144 that control the second stage pass gates 132 and 134 with the Qb outputs are both programmed to output logic low on the Q output. Memory cell 146 is also programmed to provide logic low on the Q output. This results in the Qb outputs of memory cells 142 and 144 being logic high, which turns on NMOS transistors 402 and 404 in the transistor stack and thereby provides the power supply voltage at logic high to the input node 158 of the output stage. Pass gate 136 is turned off.

A larger or smaller version of the multiplexer 400 may be constructed consistent with the teachings of the example multiplexer 400, in view of the multiplexers having PMOS transistor stacks as described above.

Figure 6:
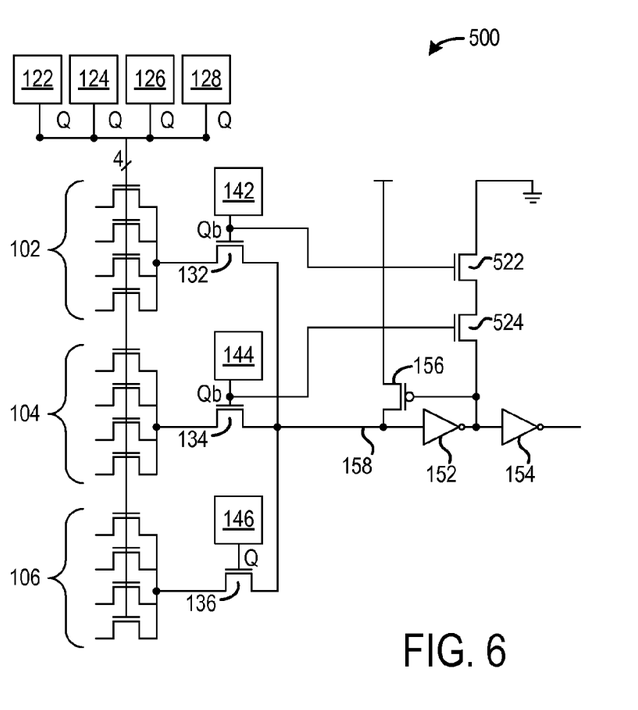
FIG. 6 is a circuit diagram of an example 12:1 multiplexer in which the transistor stack used to control provision of the constant logic high output signal is coupled between two inverters in the output stage.

FIG. 6 is a circuit diagram of an example 12:1 multiplexer 500 in which the transistor stack used to control provision of the constant logic high output signal is coupled between the two inverters 152 and 154 in the output stage. The Qb output from memory cell 142 is coupled to the gate of transistor 522, and the Qb output from memory cell 144 is coupled to the gate of transistor 524. The gates of pass gates 132 and 134 are also coupled to the Qb outputs of memory cells 142 and 144, respectively.

Transistor 522 of the transistor stack is tied to ground so that when both of transistors 522 and 524 are turned on, the keeper PMOS transistor 156 also turns on, thereby providing the power supply voltage at logic high to the output stage of the multiplexer. Thus, to configure multiplexer 500 to an unused state and provide logic high output, memory cells 142, 144, and 146 are programmed to output logic low on the Q output (logic high on the Qb output).

To configure the multiplexer 500 to a used state for one of the legs provided by pass gates 132 or 134, the memory cell of the required second-stage pass gate is programmed to output a logic low signal on the Q output, which would turn on the one of pass gates 132 or 134 by way of the Qb output. The memory cell controlling the unused one of pass gates 132 or 134 would be programmed to output logic high on the Q output. The memory cell 146 controlling the unused pass gate 136 would be programmed to provide logic low on the Q output. To configure the leg having pass gate 136 for signal selection, memory cell 146 is programmed to provide logic high on the Q output, as are both of memory cells 142 and 144.

When the multiplexer 500 is in a used state, only one of the second stage pass gates is conducting, and only one (at most) of the NMOS transistors 522 or 524 may be turned on, thereby turning off transistor 156 and not providing a logic high signal from the power supply voltage via the transistor 156.

A larger or smaller version of the multiplexer 500 may be constructed consistent with the teachings of the example multiplexer 500, in view of the multiplexers having PMOS transistor stacks as described above.

Multiplexer 500 may require transistor sizes of suitable ratios to prevent the inverter 152 from over driving the NMOS stack when the transistor 156 is conducting from the power supply voltage.

For multiplexer 500 to be unused and provide a constant logic low signal, the transistor stack would be tied to the power supply instead of ground. Also, the PMOS half-latch 156 would be replaced with an NMOS half-latch tied to ground.

In another adaptation, PMOS transistors could be used instead of NMOS transistors for the pass gates. In such an implementation, an NMOS half-latch to ground may be used in place of the PMOS half-latch 156, for example.

Figure 7:
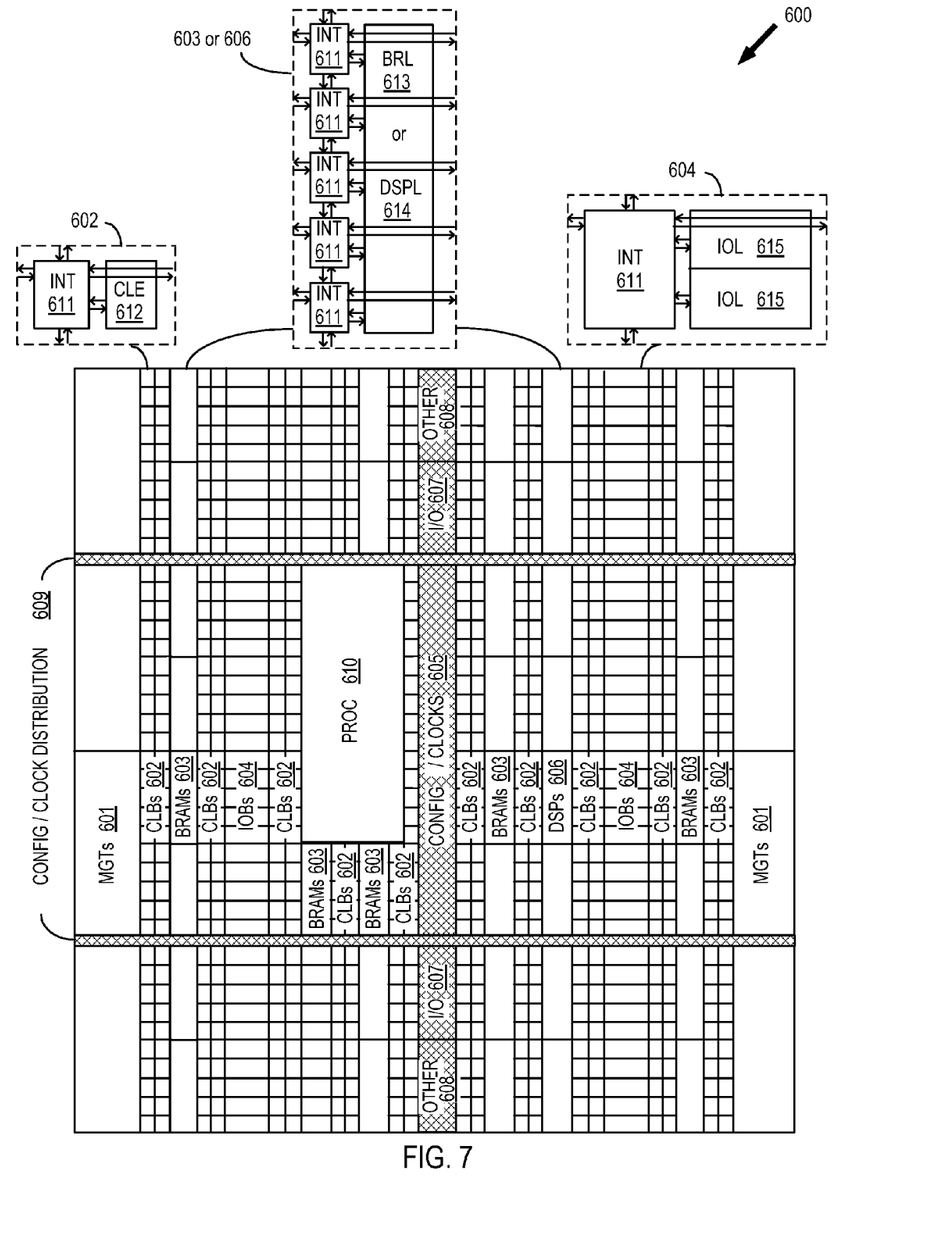
FIG. 7 illustrates an example field programmable gate array (FPGA) architecture in which the interconnect multiplexers may be used according to the teachings herein.

FIG. 7 illustrates an example field programmable gate array (FPGA) architecture 600 in which the interconnect multiplexers may be used according to the teachings herein. Those skilled in the art will appreciate that the FPGA of FIG. 7 provides only one example of an integrated circuit device in which the embodiments of the present invention may be used. FPGA 600 includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include a hardwired processor 610.

In some FPGAs, each programmable tile includes a programmable interconnect element (INT 611) having standardized connections to and from a corresponding interconnect element in each adjacent tile. Therefore, the programmable interconnect elements taken together implement the programmable interconnect resources for the illustrated FPGA. Each programmable interconnect element, or selected ones thereof, may be implemented in accordance with the example embodiments of the interconnect multiplexers as described herein.

The programmable interconnect element (INT 611) also includes the connections to and from the programmable logic primitive within the same tile, as shown by the examples included at the top of FIG. 7. For example, a CLB 602 can include a configurable logic primitive (CLE 612) that can be programmed to implement user logic plus a single programmable interconnect element (INT 611). A BRAM 603 can include a BRAM logic primitive (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic primitive (DSPL 614) in addition to an appropriate number of programmable interconnect elements. An IOB 604 can include, for example, two instances of an input/output logic primitive (IOL 615) in addition to one instance of the programmable interconnect element (INT 611). As will be clear to those of skill in the art, the actual I/O pads connected, for example, to the I/O logic primitive 615 are manufactured using metal layered above the various illustrated logic blocks, and typically are not confined to the area of the input/output logic primitive 615.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 610 shown in FIG. 7 spans several columns of CLBs and BRAMs.

In the pictured embodiment, a columnar area near the center of the die (shown shaded in FIG. 7) is used for configuration, clock, and other control logic. Horizontal areas 609 extending from this column are used to distribute the clocks and configuration signals across the breadth of the FPGA.

A configuration port (not shown), as recognized by those skilled in the art, may be used to access configuration memory in the FPGA 616 to configure the programmable logic and interconnect resources. Once configured with a configuration bitstream loaded into the configuration memory, the FPGA implements one or more functions of a particular design. In one embodiment, an internal scrubber (not shown) may continuously read and correct configuration memory via an internal configuration access port.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

The present invention is thought to be applicable to a variety of systems needing programmable multiplexers to configurably provide a constant logic level signal. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A selection circuit programmable in a first state to hold the output signal of the selection circuit at a constant logic level and programmable in a second state to select 1 of n input signals as the output signal, comprising:
   a first bank of transistors having sources receiving the n input signals, and having gates coupled to a first set of memory cells;
   a second bank of transistors including two or more transistors having gates coupled to a second set of memory cells, at least two transistors of the second bank having gates coupled to a complemented output of a respective one of the second set of memory cells, and each transistor in the second bank having a source coupled to drains of transistors in a respective subset of transistors of the first bank;
   an output stage coupled to drains of the second bank of transistors;
   a pair of serially coupled transistors coupled to a constant logic level signal and having gates coupled to two memory cells of the second set that control the at least at least two transistors of the second bank; and
   wherein the output stage outputs the constant logic level signal in response to the selection circuit being programmed in the first state and the serially coupled transistors conducting, and the output stage outputs the selected input signal in response to the selection circuit being programmed in the second state and the serially coupled transistors not conducting.

2. The circuit of claim 1, wherein a source of a first transistor of the pair is coupled to receive a power supply voltage for providing a logic high signal, a drain of the second transistor of the pair is coupled to drains of transistors of the second bank of transistors.

3. The circuit of claim 1, wherein the pair of serially coupled transistors are PMOS transistors having gates coupled to non-complemented outputs of the two memory cells, respectively.

4. The circuit of claim 1, wherein the pair of serially coupled transistors are NMOS transistors having gates coupled to complemented outputs of the two memory cells, respectively.

5. The circuit of claim 1, wherein the output stage comprises:
   a pair of serially coupled inverters having an input of a first inverter of the pair coupled to the drains of transistors in the second bank; and
   a feedback transistor having a source coupled to receive a power supply voltage for providing a logic high signal, a drain coupled to input of the first inverter, and a gate coupled to a node between output of the first inverter and input of the second inverter.

6. The circuit of claim 5, wherein a source of a first transistor of the pair is coupled to receive a power supply voltage for providing a logic high signal, a drain of the second transistor of the pair is coupled to drains of transistors of the second bank of transistors.

7. The circuit of claim 6, wherein the pair of serially coupled transistors are PMOS transistors having gates coupled to non-complemented outputs of the two memory cells, respectively.

8. The circuit of claim 6, wherein the pair of serially coupled transistors are NMOS transistors having gates coupled to complemented outputs of the two memory cells, respectively.

9. The circuit of claim 5, wherein a source of a first transistor of the pair is coupled to ground, and a drain of the second transistor of the pair is coupled to the node between output of the first inverter and input of the second inverter.

10. The circuit of claim 9, wherein the pair of serially coupled transistors are NMOS transistors having gates coupled to complemented outputs of the two memory cells, respectively.

11. The circuit of claim 1, wherein the pair of serially coupled transistors is coupled to a power supply voltage to provide a constant logic high signal to the output stage in response to the selection circuit being programmed in the first state.

12. The circuit of claim 1, wherein the pair of serially coupled transistors is coupled to ground to provide a constant logic low signal to the output stage in response to the selection circuit being programmed in the first state.

13. A selection circuit programmable in a first state to hold the output signal of the selection circuit at a constant logic level and programmable in a second state to select 1 of n input signals as the output signal, comprising:
   a first bank of transistors having sources receiving the n input signals, and having gates coupled to a first set of memory cells;
   a second bank of transistors including two or more transistors having gates coupled to a second set of memory cells, at least two transistors of the second bank having gates coupled to a complemented output of a respective one of the second set of memory cells, and each transistor in the second bank having a source coupled to drains of transistors in a respective subset of transistors of the first bank;
   an output stage coupled to drains of the second bank of transistors; and
   means, responsive to states of two memory cells of the second set that control the at least two transistors of the second bank, for providing the signal at the constant logic level to the output stage in response to the selection circuit being programmed in the first state, and for providing the selected input signal to the output stage in response to the selection circuit being programmed in the second state.

14. An integrated circuit, comprising:
   a plurality of programmable logic resources;
   a plurality of programmable interconnect resources;
   a configuration memory coupled to the programmable logic resources and to the programmable interconnect resources;
   wherein one or more of the programmable interconnect resources includes an interconnect multiplexer, programmable in a first state to hold the output signal of the multiplexer at a constant logic level and programmable in a second state to select 1 of n input signals as the output signal, the multiplexer including:
      a first bank of transistors having sources receiving the n input signals, and having gates coupled to a first set of memory cells;
      a second bank of transistors including two or more transistors having gates coupled to a second set of memory cells, at least two transistors of the second bank having gates coupled to a complemented output of a respective one of the second set of memory cells, and each transistor in the second bank having a source coupled to drains of transistors in a respective subset of transistors of the first bank;

an output stage coupled to drains of the second bank of transistors;

a pair of serially coupled transistors having gates coupled to two memory cells of the second set that control the at least two transistors of the second bank; and wherein the output stage outputs the constant logic level signal in response to the multiplexer being programmed in the first state and the serially coupled transistors conducting, and the output stage outputs the selected input signal in response to the multiplexer being programmed in the second state and the serially coupled transistors not conducting.

15. The integrated circuit of claim 14, wherein a source of a first transistor of the pair is coupled to receive a power supply voltage for providing a logic high signal, a drain of the second transistor of the pair is coupled to drains of transistors of the second bank of transistors.

16. The integrated circuit of claim 14, wherein the pair of serially coupled transistors are PMOS transistors having gates coupled to non-complemented outputs of the two memory cells, respectively.

17. The integrated circuit of claim 14, wherein the pair of serially coupled transistors are NMOS transistors having gates coupled to complemented outputs of the two memory cells, respectively.

18. The integrated circuit of claim 14, wherein the output stage comprises:

a pair of serially coupled inverters having an input of a first inverter of the pair coupled to the drains of transistors in the second bank; and a feedback transistor having a source coupled to receive a power supply voltage for providing a logic high signal, a drain coupled to input of the first inverter, and a gate coupled to a node between output of the first inverter and input of the second inverter.

19. The integrated circuit of claim 18, wherein a source of a first transistor of the pair is coupled to receive a power supply voltage for providing a logic high signal, a drain of the second transistor of the pair is coupled to drains of transistors of the second bank of transistors.

20. The integrated circuit of claim 19, wherein the pair of serially coupled transistors are PMOS transistors having gates coupled to non-complemented outputs of the two memory cells, respectively.

* * * * *